United States Patent
Byers et al.

(10) Patent No.: US 10,849,250 B2
(45) Date of Patent: Nov. 24, 2020

(54) INTEGRATION OF POWER, DATA, COOLING, AND MANAGEMENT IN A NETWORK COMMUNICATIONS SYSTEM

(71) Applicant: CISCO TECHNOLOGY, INC., San Jose, CA (US)

(72) Inventors: Charles Calvin Byers, Wheaton, IL (US); Gonzalo Salgueiro, Raleigh, NC (US); M. David Hanes, Lewisville, NC (US); Joel Richard Goergen, Soulsbyville, CA (US); Joseph Michael Clarke, Cary, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/354,082

(22) Filed: Mar. 14, 2019

(65) Prior Publication Data
US 2020/0296856 A1   Sep. 17, 2020

(51) Int. Cl.
| | |
|---|---|
| H05K 7/00 | (2006.01) |
| H05K 7/14 | (2006.01) |
| H05K 7/20 | (2006.01) |
| G02B 6/44 | (2006.01) |

(52) U.S. Cl.
CPC ......... *H05K 7/1492* (2013.01); *G02B 6/4401* (2013.01); *H05K 7/1487* (2013.01); *H05K 7/1491* (2013.01); *H05K 7/20536* (2013.01)

(58) Field of Classification Search
USPC ........................................................ 361/831
See application file for complete search history.

(56) References Cited

U.S. PATENT DOCUMENTS

| | | | |
|---|---|---|---|
| 3,335,324 A | 8/1967 | Buckeridge | |
| 4,811,187 A | 3/1989 | Nakajima | |
| 4,997,388 A * | 3/1991 | Dale | H01R 25/003 |
| | | | 439/110 |
| 6,220,955 B1 | 4/2001 | Posa | |
| 6,259,745 B1 | 7/2001 | Chan | |
| 6,685,364 B1 | 2/2004 | Brezina | |
| 6,826,368 B1 | 11/2004 | Koren | |
| 6,855,881 B2 | 2/2005 | Khoshnood | |
| 7,325,150 B2 | 1/2008 | Lehr | |

(Continued)

FOREIGN PATENT DOCUMENTS

| | | |
|---|---|---|
| CN | 1209880 C | 7/2005 |
| CN | 201689347 U | 12/2010 |

(Continued)

OTHER PUBLICATIONS https://www.fischerconnectors.com/us/en/products/fiberoptic.

(Continued)

*Primary Examiner* — Hung S. Bui
(74) *Attorney, Agent, or Firm* — Cindy Kaplan

(57) ABSTRACT

In one embodiment, a system includes a central hub comprising a power source, a data switch, a coolant system, and a management module, a plurality of network devices located within an interconnect domain of the central hub, and at least one combined cable connecting the central hub to the network devices and comprising a power conductor, a data link, a coolant tube, and a management communications link contained within an outer cable jacket.

20 Claims, 8 Drawing Sheets

(56) References Cited

U.S. PATENT DOCUMENTS

| | | |
|---|---|---|
| 7,420,355 B2 | 9/2008 | Liu |
| 7,583,703 B2 | 9/2009 | Bowser |
| 7,589,435 B2 | 9/2009 | Metsker |
| 7,593,747 B1 | 9/2009 | Karam |
| 7,616,465 B1 | 11/2009 | Vinciarelli |
| 7,813,646 B2 | 10/2010 | Furey |
| 7,835,389 B2 | 11/2010 | Yu |
| 7,915,761 B1 | 3/2011 | Jones |
| 7,921,307 B2 | 4/2011 | Karam |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,184,525 B2 | 5/2012 | Karam |
| 8,276,397 B1 | 10/2012 | Carlson |
| 8,310,089 B2 | 11/2012 | Schindler |
| 8,345,439 B1 | 1/2013 | Goergen |
| 8,350,538 B2 | 1/2013 | Cuk |
| 8,358,893 B1 | 1/2013 | Sanderson |
| 8,700,923 B2 | 4/2014 | Fung |
| 8,781,637 B2 | 7/2014 | Eaves |
| 8,829,917 B1 | 9/2014 | Lo |
| 8,836,228 B2 | 9/2014 | Xu |
| 8,842,430 B2 | 9/2014 | Hellriegel |
| 9,024,473 B2 | 5/2015 | Huff |
| 9,184,795 B2 | 11/2015 | Eaves |
| 9,189,043 B2 | 11/2015 | Vorenkamp |
| 9,273,906 B2 | 3/2016 | Goth |
| 9,319,101 B2 | 4/2016 | Lontka |
| 9,373,963 B2 | 6/2016 | Kuznelsov |
| 9,419,436 B2 | 8/2016 | Eaves |
| 9,484,771 B2 * | 11/2016 | Braylovskiy ........... H02J 9/061 |
| 9,510,479 B2 | 11/2016 | Vos |
| 9,531,551 B2 | 12/2016 | Balasubramanian |
| 9,590,811 B2 | 3/2017 | Hunter, Jr. |
| 9,640,998 B2 | 5/2017 | Dawson |
| 9,665,148 B2 | 5/2017 | Hamdi |
| 9,693,244 B2 | 6/2017 | Maruhashi |
| 9,734,940 B1 | 8/2017 | McNutt |
| 9,853,689 B2 | 12/2017 | Eaves |
| 9,874,930 B2 | 1/2018 | Vavilala |
| 9,882,656 B2 | 1/2018 | Sipes |
| 9,893,521 B2 | 2/2018 | Lowe |
| 9,948,198 B2 | 4/2018 | Imai |
| 10,007,628 B2 | 6/2018 | Pitigoi-Aron |
| 10,028,417 B2 | 7/2018 | Schmidtke |
| 10,407,995 B2 | 9/2019 | Moeny |
| 2002/0126967 A1 | 9/2002 | Panak |
| 2004/0000816 A1 | 1/2004 | Khoshnood |
| 2004/0033076 A1 | 2/2004 | Song |
| 2004/0043651 A1 | 3/2004 | Bain |
| 2004/0073703 A1 | 4/2004 | Boucher |
| 2005/0197018 A1 | 9/2005 | Lord |
| 2005/0268120 A1 | 12/2005 | Schindler |
| 2006/0202109 A1 | 9/2006 | Delcher |
| 2007/0103168 A1 | 5/2007 | Batten |
| 2007/0288125 A1 | 12/2007 | Quaratiello |
| 2008/0198635 A1 | 8/2008 | Hussain |
| 2008/0229120 A1 | 9/2008 | Diab |
| 2008/0310067 A1 | 12/2008 | Diab |
| 2010/0077239 A1 | 3/2010 | Diab |
| 2010/0117808 A1 | 5/2010 | Karam |
| 2010/0171602 A1 | 7/2010 | Kabbara |
| 2010/0190384 A1 | 7/2010 | Lanni |
| 2010/0290190 A1 | 11/2010 | Chester |
| 2011/0290497 A1 | 1/2011 | Stenevik |
| 2011/0083824 A1 | 4/2011 | Rogers |
| 2011/0266867 A1 | 11/2011 | Schindler |
| 2012/0064745 A1 | 3/2012 | Ottliczky |
| 2012/0170927 A1 | 7/2012 | Huang |
| 2012/0201089 A1 | 8/2012 | Barth |
| 2012/0231654 A1 | 9/2012 | Conrad |
| 2012/0317426 A1 | 12/2012 | Hunter, Jr. |
| 2012/0319468 A1 | 12/2012 | Schneider |
| 2013/0077923 A1 | 3/2013 | Peeters Weem |
| 2013/0079633 A1 | 3/2013 | Peeters Weem et al. |
| 2013/0103220 A1 | 4/2013 | Eaves |
| 2013/0249292 A1 | 9/2013 | Blackwell, Jr. |
| 2013/0272721 A1 | 10/2013 | van Veen |
| 2013/0329344 A1* | 12/2013 | Tucker ................. H02B 15/00 361/633 |
| 2014/0126151 A1* | 5/2014 | Campbell ............ H05K 7/2079 361/699 |
| 2014/0258742 A1 | 9/2014 | Chien |
| 2015/0078740 A1 | 3/2015 | Sipes, Jr. |
| 2015/0106539 A1 | 4/2015 | Leinonen |
| 2015/0115741 A1 | 4/2015 | Dawson |
| 2015/0215001 A1 | 7/2015 | Eaves |
| 2015/0333918 A1 | 11/2015 | White, III |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0134331 A1 | 5/2016 | Eaves |
| 2016/0142217 A1 | 5/2016 | Gardner |
| 2016/0188427 A1* | 6/2016 | Chandrashekar ... G06F 11/0709 714/4.11 |
| 2016/0197600 A1 | 7/2016 | Kuznetsov |
| 2016/0365967 A1 | 7/2016 | Tu |
| 2016/0241148 A1 | 8/2016 | Kizilyalli |
| 2016/0262288 A1 | 9/2016 | Chainer |
| 2016/0294500 A1 | 10/2016 | Chawgo |
| 2016/0308683 A1 | 10/2016 | Pischl |
| 2016/0352535 A1 | 12/2016 | Hiscock |
| 2017/0054296 A1 | 2/2017 | Daniel |
| 2017/0110871 A1 | 4/2017 | Foster |
| 2017/0146260 A1 | 5/2017 | Ribbich |
| 2017/0155517 A1 | 6/2017 | Cao |
| 2017/0164525 A1 | 6/2017 | Chapel |
| 2017/0155518 A1 | 7/2017 | Yang |
| 2017/0214236 A1 | 7/2017 | Eaves |
| 2017/0229886 A1 | 8/2017 | Eaves |
| 2017/0234738 A1 | 8/2017 | Ross |
| 2017/0248976 A1 | 8/2017 | Moller |
| 2017/0294966 A1* | 10/2017 | Jia ......................... H04B 10/64 |
| 2017/0325320 A1 | 11/2017 | Wendt |
| 2018/0024964 A1 | 1/2018 | Mao |
| 2018/0060269 A1 | 3/2018 | Kessler |
| 2018/0088648 A1 | 3/2018 | Otani |
| 2018/0098201 A1 | 4/2018 | Torello |
| 2018/0102604 A1 | 4/2018 | Keith |
| 2018/0123360 A1 | 5/2018 | Eaves |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec |

FOREIGN PATENT DOCUMENTS

| | | |
|---|---|---|
| CN | 205544597 | 8/2016 |
| CN | 104081237 B | 10/2016 |
| CN | 104412541 B | 5/2019 |
| EP | 1936861 A1 | 6/2008 |
| EP | 2120443 A1 | 11/2009 |
| EP | 2693688 A1 | 2/2014 |
| WO | WO199316407 A1 | 8/1993 |
| WO | WO2010053542 | 5/2010 |
| WO | WO2017054030 | 4/2017 |
| WO | WO2017167926 | 10/2017 |
| WO | 2018017544 A1 | 1/2018 |
| WO | WO2019023731 | 2/2019 |
| WO | 2019177774 A1 | 9/2019 |

OTHER PUBLICATIONS http://www.strantech.com/products/tfoca-genx-hybrid-2x2-fiber-optic-copper-connector/.
http://www.qpcfiber.com/product/connectors/e-link-hybrid-connector/.
https://www.lumentum.com/sites/default/files/technical-library-items/powerovertiber-tn-pv-ae_0.pdf.
"Network Remote Power Using Packet Energy Transfer", Eaves et al., www.voltserver.com, Sep. 2012.

(56) References Cited

OTHER PUBLICATIONS

Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.

Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.

Yencheck, Thermal Modeling of Portable Power Cables, 1993.

Zhang, Machine Learning-Based Temperature Prediction for Runtime Thermal Management across System Components, Mar. 2016.

Data Center Power Equipment Thermal Guidelines and Best Practices.

Dynamic Thermal Rating of Substation Terminal Equipment by Rambabu Adapa, 2004.

Chen, Real-Time Termperature Estimation for Power MOSEFETs Conidering Thermal Aging Effects:, IEEE Trnasactions on Device and Materials Reliability, vol. 14, No. 1, Mar. 2014.

* cited by examiner

INTEGRATION OF POWER, DATA, COOLING, AND MANAGEMENT IN A NETWORK COMMUNICATIONS SYSTEM

TECHNICAL FIELD

The present disclosure relates generally to communications networks, and more particularly, to power, data, management, and cooling integration in a communications network.

BACKGROUND

In conventional communications systems, installation of network devices in an equipment rack is often complex due to the use of individual cables to provide power, data, and other utilities. Network devices may have both their data connectivity and power needs met over a single combined function cable through the use of PoE (Power over Ethernet) or Universal Serial Bus (USB). However, conventional PoE systems have limited power capacity, which may be inadequate for many classes of devices. Also, if the power is increased, traditional cooling methods may be inadequate for high powered devices.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
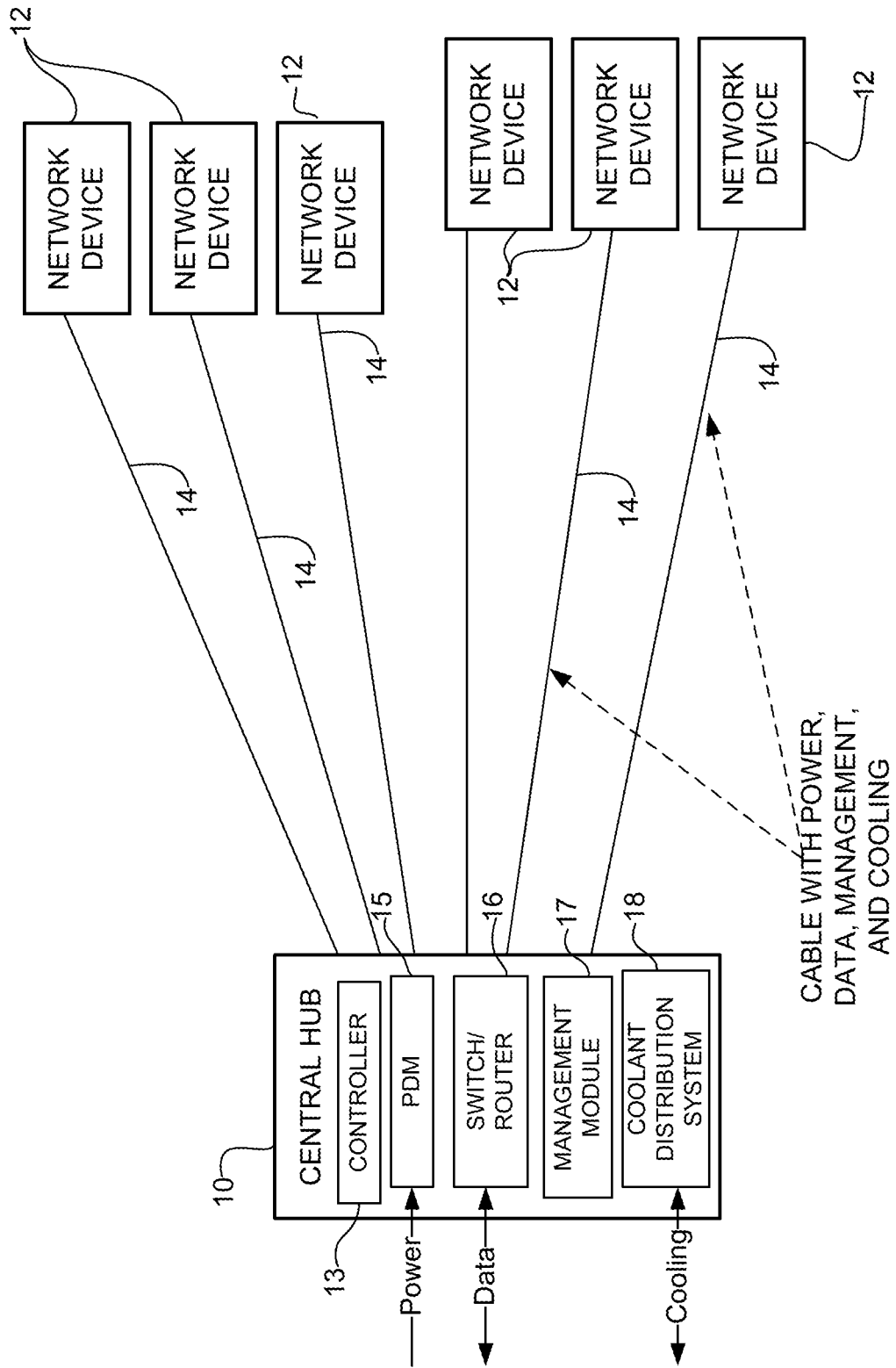
FIG. 1 illustrates an example of a communications system with power, data, cooling, and management delivered over combined cables in a point-to-point topology, in accordance with one embodiment.

In one embodiment, a system generally comprises a central hub comprising a power source, a data switch, a coolant distribution system, and a management module, a plurality of network devices located within an interconnect domain of the central hub, and at least one combined cable connecting the central hub to the network devices and comprising a power conductor, a data link, a coolant tube, and a management communications link contained within an outer cable jacket.

In one or more embodiments, the central hub and network devices are rack mounted devices.

In one or more embodiments, the combined cable connects to a back of the network devices with the network devices inserted into a front of the rack.

In one or more embodiments, the combined cable comprises a plurality of combined cables, each of the combined cables connecting the central hub to one of the network devices.

In one or more embodiments, the combined cable comprises multi-tap connections to each of the network devices.

In one or more embodiments, the central hub and the network devices form a passive optical network over the optical fiber.

In one or more embodiments, the system further comprises a redundant central hub connected to the network devices with at least one backup combined cable.

In one or more embodiments, the power source is operable to provide at least 1000 watts of pulse power.

In one or more embodiments, the data link comprises a pair of optical fibers operable to deliver at least 100 Gb/s to each of the network devices.

In one or more embodiments, the central hub comprises a reserve power supply operable to supply power to the network devices for a specified period of time.

In one or more embodiments, the coolant distribution system comprises a chilled reserve coolant tank.

In one or more embodiments, the management communications link comprises a single pair of wires for Single Pair Ethernet (SPE) management communications.

In one or more embodiments, the management communications link defines a management overlay network.

In one or more embodiments, the central hub forms a storage overlay network with the network devices over the combined cable.

In one or more embodiments, the combined cable further comprises a cable identifier light emitting diode located within the combined cable or a connector coupled to the combined cable for use in identifying the combined cable or a status of the combined cable.

In one or more embodiments, the central hub operates as a Top of Rack (ToR) switch and the network devices comprise servers.

In another embodiment, an apparatus generally comprises a power source, a data switch, a coolant distribution system, a management module, at least one port for connection to a combined cable comprising a power conductor, a data link, a coolant tube, and a management communications link contained within an outer cable jacket, and a control processor for control of interactions between power, data, and cooling delivered on the combined cable to a plurality of network devices. The power source, data switch, coolant distribution system, management module, and control processor are contained within a chassis.

In yet another embodiment, a method generally comprises inserting a central hub into a rack, the central hub comprising a power source, a data switch, a coolant distribution system, and a management module contained within a chassis, connecting a combined cable comprising a power conductor, a data link, a coolant tube and a management communications link within an outer cable jacket to the central hub, inserting a network device into the rack and connecting the network device to the combined cable, and providing power, data, cooling, and management to the network device from the central hub over the combined cable.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Installation of servers, routers, storage engines, accelerators, fog nodes, IoT (Internet of Things) devices, gateways, and similar network devices is often complex. The hardware is typically secured to its mounting position, and then power, data, and out of band management cables are separately connected. These cables contribute significantly to system complexity and cost, and often increase failure modes of the system. In one example, an equipment rack with 40 1 RU (Rack Unit) servers may have hundreds of discrete cables that need to be purchased, installed, and maintained.

In conventional Power over Ethernet (PoE) systems used to simultaneously transmit power and data communications, power is delivered over the same twisted pair cable used for data. The maximum power delivery capacity of standard PoE is approximately 100 Watts (W), but many classes of powered devices would benefit from power delivery of 1000 W or more. The data capability is also limited to the bandwidth of the twisted pair, which is typically 10 Gb/s (Gigabit per second) or less. While use of PoE as a single cable interconnect in large scale and distributed computing systems would simplify installation and maintenance and reduce cable congestion, conventional PoE systems may not scale to the power requirements (e.g., about 1000 W), interconnect bandwidth requirements (e.g., over 40 Gb/s per server), or provide needed cooling.

For high-powered devices, especially those with high thermal density packaging or total dissipation over a few hundred watts, traditional convection cooling methods may be inadequate. Forced air convection with fans typically becomes impractical once the volumetric power density exceeds about 150 W per liter. Next generation servers (e.g., with eight or more high power CPU (Central Processing Unit), GPU (Graphics Processing Unit), and/or TPU (Tensor Processing Unit) chips) would benefit from power dissipation capabilities on the order of 1000 W per 1 RU package. Routers supporting dozens of 100 Gb/s or greater links have similar power requirements. This power density is very difficult to cool using fans and may result in air cooling systems that are so loud that they exceed OSHA (Occupational Safety and Health Administration) acoustic noise limits. Research is being conducted into replacing forced air cooling with pumped liquid coolant, which is an important trend in future data center designs. However, use of a separate set of tubes to deliver liquid coolant further increases the complexity of cable systems.

Out of band management and storage networking is also a key capability in rack level server installations. One or more overlay networks (beyond the mainstream Ethernet interconnect) are often provided to each server to establish a side channel for management traffic, alarm monitoring, and connection to storage disk farms, and the like. However, these overlay networks increase system costs and complexity.

The embodiments described herein provide interconnect technology to simultaneously address the above noted issues. One or more embodiments provide a highly efficient, compact, cost effective way to interconnect network devices such as servers, routers, storage engines, or similar devices in a rack (e.g., cabinet, server rack, or other frame or enclosure for supporting network devices) with central data, management, power, and cooling resources. In one or more embodiments, a combined cable provides data, power, cooling, and management. For example, a combined cable may carry optical fiber delivered data, management (e.g., traffic management, alarm monitoring, connection to storage disk farms, or other management or storage overlay network functions), power (e.g., pulse power, power ≥100 W, power over ≥1000 W), and cooling (e.g., liquid, gas, or multi-phase coolant) from a central hub to a large number of network devices (e.g., servers, routers, storage engines, fog nodes, IoT devices, or similar network devices) within the central hub's interconnect domain. In one or more embodiments, the management capabilities associated with the combined cable and hub implements interaction modes between the data interconnect, power, cooling, and management overlay capabilities of the infrastructure. As described in detail below, a central hub configured to provide power, data, cooling, and management may include a hub control processor, data switch (switch, router, switch/router), power distribution system, management module (e.g., providing physical or virtual management function), and coolant distribution system. In one or more embodiments, the central hub may also provide short-term power and coolant backup capability. The combined cable and unified central hub communications system described herein may greatly improve efficiency, reduce complexity of installation and maintenance, and reduce cost of high density and distributed computing systems, while facilitating tighter coupling between systems.

The embodiments described herein operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT), optical network, Internet, intranet, fog network, or any other network). The network may include any number of communications systems (e.g., server farms, distributed computation environments (industrial computing, edge computers, fog nodes), data center racks, or other communications systems with a centralized interconnect domain) comprising a central hub operable to deliver data, power, management networking, and cooling over a combined cable to a plurality of network devices, as described herein.

Referring now to the drawings, and first to FIG. 1, an example of a system for integrating delivery of power, fiber delivered data, Ethernet management, and cooling over point-to-point combined cables 14 is shown. For simplification, only a small number of nodes are shown. The system is configured to provide power (e.g., power greater than 100 W, power greater than 1000 W, pulse power), data (e.g., optical data), cooling (e.g., liquid, gas, or multi-phase cooling), and management (e.g., Ethernet management data, management communications link, management networking, SPE (Single Pair Ethernet) management data, management overlay, storage overlay, management and storage overlays) from a central hub 10 to a plurality of network devices 12 (e.g., servers, routers, storage engines, fog nodes, IoT devices, or similar network elements, electronic components, or devices). Signals may be exchanged among communications equipment and power transmitted from power sourcing equipment (e.g., central hub 10) to powered devices (e.g., communications devices 12). As described in detail below with respect to FIG. 3, the system provides power, data, management, and cooling to the network devices 12 configured to receive the data, power, management, and cooling over a cabling system in which each combined cable 14 comprises an optical fiber (one or more optical fibers), power conductor (copper wires for power), wires for Ethernet management data (e.g., one or more wire pairs) and a coolant tube (one or more cooling tubes). Cables 14 extending from the central hub 10 to the remote communications devices 12 are configured to transmit power, optical data, Ethernet management, and cooling in a single cable (combined cable, multi-function cable, multi-use cable, hybrid cable). The cables 14 may be formed from any material suitable to carry electrical power, data (copper, fiber), and coolant (liquid, gas, or multi-phase) and may carry any number of electrical wires, optical fibers, and cooling tubes in any arrangement contained within an outer cable jacket.

As shown in the example of FIG. 1, the system comprises the central hub 10 in communication with the remote devices 12 via the combined cables 14, each cable configured for delivering power, optical data, cooling, and management data. The central hub 10 may be in communication with any number of network devices 12. In one example, the central hub 10 operates as a Top of Rack (ToR) switch in communication with a plurality of servers (e.g., 40 1 RU servers or any other number or configuration of servers, storage devices, routers, switches, or other network devices). The central hub 10 may be used, for example, in place of a ToR switch, PDU (Power Distribution Unit), management terminal server, and rack-level cooling infrastructure. As described in detail below, the central hub 10 comprises a control processor 13 for control of interactions between power, data, and cooling delivered on the combined cables 14.

In the example shown in FIG. 1, the central hub 10 comprises the controller (hub control processor) 13, power distribution module (PDM) 15 for receiving power (e.g., building power from a power grid, renewable energy source, generator or battery), a network interface (e.g., switch, router, fabric card, line card) 16 for receiving data from or transmitting data to a network (e.g., Internet, network backbone), a management module (e.g., management switch, controller, router, terminal server, storage hub, virtualized traffic management) 17, which may supplement the main data switch 16 for management and storage overlay networks, and a coolant distribution system 18 in fluid communication with a cooling plant. In one or more embodiments, a redundant central hub (not shown) may provide backup or additional power, bandwidth, cooling, or management, as needed in the communications system.

The network devices 12 may include, for example, servers, routers, or storage engines located in a rack or cabinet or IoT devices or fog nodes located in a distributed computational environment (e.g., industrial computing, edge, fog) in which the combined cables provide data, power, management, and cooling to distributed endpoints within the central hub's interconnect domain. In one or more embodiments, the network devices 12 may operate at power levels greater than 100 W (e.g., 1000 W or any other power level). The network devices 12 may also be in communication with one or more other devices (e.g., fog node, IoT device, sensor, and the like) and may deliver power to equipment using PoE or USB. For example, one or more of the network devices 12 may deliver power using PoE to electronic components such as IP (Internet Protocol) cameras, VoIP (Voice over IP) phones, video cameras, point-of-sale devices, security access control devices, residential devices, building automation devices, industrial automation, factory equipment, lights (building lights, streetlights), traffic signals, and many other electrical components and devices.

Figure 2:
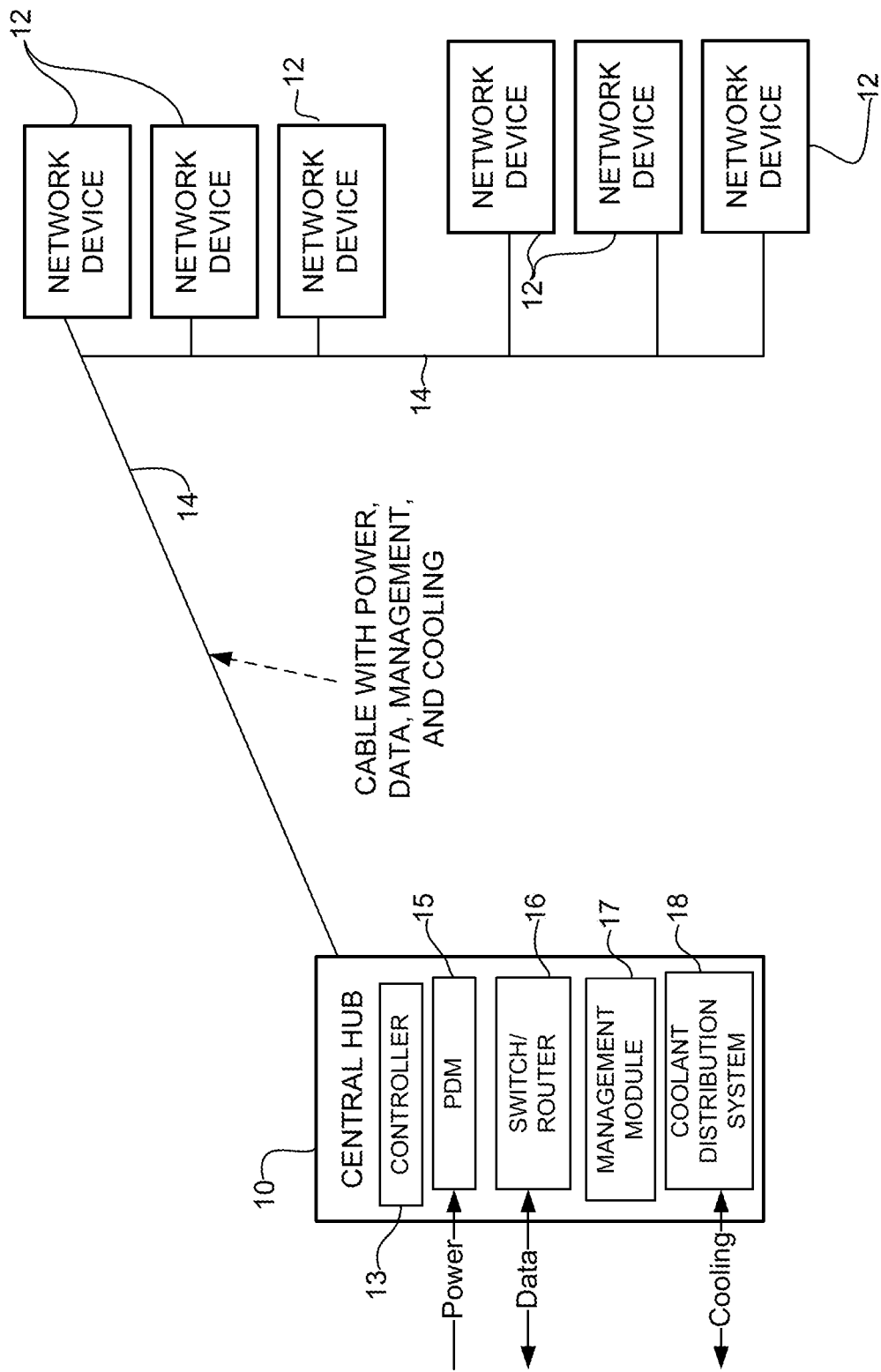
FIG. 2 illustrates an example of a communications system with power, data, cooling, and management delivered over a combined cable in a taper topology, in accordance with one embodiment.

FIG. 2 illustrates another example in which the central hub 10 delivers power, optical data, management, and cooling over a single combined cable 14 to a plurality of the network devices 12 using a taper topology. The combined cable 14 may comprise multiple taps (multi-taps) for connecting multiple servers or other endpoints together from a single source or set of master servers using a taper topology.

In one or more embodiments, a PON (Passive Optical Network) (e.g., 10G PON) may use multiple taps over the optical fibers with a multi-tap configuration of the power (e.g., pulse power) and cooling systems. For example, 10G of PON communications bandwidth may be split between a small community of servers. PON may provide, for example, dynamic bandwidth on demand for a cluster of servers 12 in the same cabinet sharing one combined cable 14 and may also be valuable in situations where client devices are widely distributed (e.g., series of street-corner fog nodes down a linear shared cable or a series of Wi-Fi or Li-Fi APs (Access Points) down a long corridor). The multi-tap power may start by sourcing, for example, 4000 W or more at the central hub 10 to the cable 14, with each server 12 tapping off the power line until the power is diminished. The servers 12 may also communicate with one another (e.g., through management data links in the combined cable 14) and dynamically reallocate their usage of cooling, power, and bandwidth based on need or requested loading.

The system may be used, for example, to create a cost effective means of creating a server farm within a rack or set of racks with a minimum amount of cabling. Maintenance is simplified since a tap may easily be removed and reattached with no disruption to the other servers 12 on the cable 14. The multi-tap variant (FIG. 2) may be preferred over the point-to-point variant (FIG. 1) for devices with highly variable power/data needs or devices that are spread out along a single path geographically. The multi-tap power and coolant distribution may be used, for example, to better serve equipment with highly variable loads or sets of equipment spread across a long distance (e.g., approaching 1 km).

It is to be understood that the network devices and topologies shown in FIGS. 1 and 2, and described above are only examples and the embodiments described herein may be implemented in networks comprising different network topologies or a different number, type, or arrangement of network devices, without departing from the scope of the embodiments.

Figure 3:
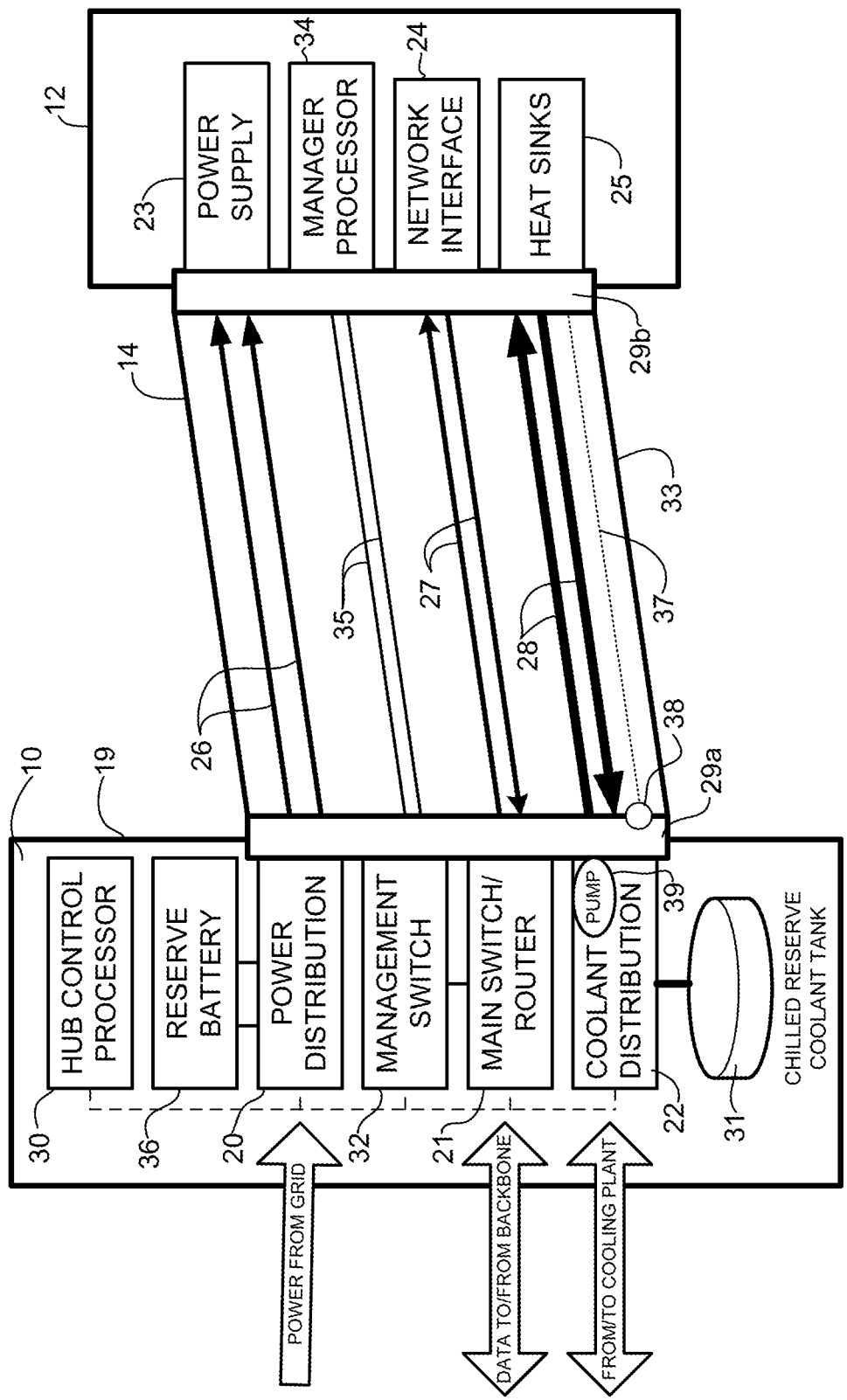
FIG. 3 illustrates an example of delivery of the power, data, cooling, and management over a combined cable between a central hub and a network device, in accordance with one embodiment.

FIG. 3 schematically illustrates the cable 14 transmitting power, data, cooling, and management communications from the central hub 10 to one of the network devices 12, in accordance with one embodiment. The central hub 10 may be supplied with one or more high bandwidth data fibers from the network backbone, electrical service (e.g., on the order of 40 kW) from a building's electrical room, and a supply of circulating liquid coolant from the building's chiller plant, for example. It may be noted that while FIG. 3 illustrates individual connections for receiving power, data, and cooling at the central hub 10 these resources may also be delivered to the central hub on a combined cable from a remote hub.

In the example shown in FIG. 3, the central hub 10 includes a power distribution module 20 for receiving power from a power grid, main switch/router (network interface, switch, router) 21 for receiving data from and transmitting data to a backbone network, a coolant distribution system 22 in fluid communication with a cooling plant, a hub control processor 30 for providing control and management for interactions between data, power, and cooling, and a management switch 32 for use in management or storage overlay networking. As shown in FIG. 3, all of these components are contained within a chassis (housing) 19 to integrate switch/router functions, control, power distribution, cooling distribution, and management networking into a single package. In one or more embodiments, the chassis 19 may be configured as a 1 RU or 2 RU network device, for example.

The power distribution module 20 provides power to a power supply module 23 at the remote device 12 over conductors 26. The main switch/router 21 at the central hub 10 is in communication with a network interface 24 at the remote device 12 via data link (e.g., optical fibers, data wires) 27. The management module 32 provides management functions and may be used, for example, in management and storage overlay networking. It is to be understood that the term management module as used herein may refer to a physical or virtual management function. For example, the management module may comprise one or more smaller data switches that may be integrated into the central hub 10 to supplement the main data switch 21 or provide virtualized management of traffic on the primary data switch 21.

The coolant distribution system 22 at the central hub 10 forms a cooling loop with coolant tubes 28 and one or more heat sinks 25 at the network device 12. The hub control processor 30 may provide control logic for the cooling loop and power and data transport functions of the combined cable 14. The hub control processor 30 may also provide control information to the management switch 32 for management of the network device 12 or a management or storage overlay. In one or more embodiments, the central hub 10 may also include a coolant backup store (e.g., chilled reserve coolant tank) 31 and a short term power source (e.g., reserve battery) 36, as described in detail below.

The cable 14 comprises power conductors 26 (e.g., heavy stranded wires for pulsed power), management communications link 35 (e.g., one or more wire pairs for transmission of Ethernet data (e.g., Single Pair Ethernet (SPE), fiber delivered management or storage overlay networks), data link 27 (e.g., at least one optical fiber in each direction for conventional systems or at least one optical fiber for bidirectional fiber systems, metallic main data interconnects (conductors, wires)), coolant tubes 28 (at least one in each direction for liquid systems, or at least one for compressed air systems), and a protective outer shield 33. These components, along with one or more additional components that may be used to isolate selected elements from each other, manage thermal conductivity between the elements, or provide protection and strength, are contained within the outer cable jacket 33 of the single combined cable 14.

In the example shown in FIG. 3, the cable 14 includes two power lines (conductors) 26 (one for each polarity), management communications link (wire pair) 35, two optical fibers 27 (for bidirectional data connectivity), and two coolant tubes 28 (supply and return) coupled to connectors 29a and 29b located at the central hub 10 and remote device 12, respectively. The cable 14 may also include an optical cable identifier 37 for use in identifying the cable or status of the cable, as described below. The connectors 29a and 29b at the central hub 10 and remote device 12 are configured to mate with the cable 14 for transmitting and receiving power, data, and cooling. In one embodiment, the connectors 29a, 29b carry power, optical data, coolant, and management data in the same connector body.

The conductors 26 may comprise heavy power conductors capable of delivering, for example, several kilowatts of power to each endpoint 12. In one example pulse power may be used in which short pulses of high voltage energy are transmitted on the cable 14 and reception is acknowledged by the endpoint 12. The system may include one or more safety features for higher power operation (e.g., insulation, process for power/cable compatibility confirmation, control circuit check for open/short, or thermal sensor). In one embodiment, the pulse power may comprise low voltage fault detection between high voltage power pulses, for example. Fault sensing may include, for example, line-to-line fault detection with low voltage sensing of the cable or powered device and line-to-ground fault detection with midpoint grounding. Touch-safe fault protection may also be provided through cable and connector designs that are touch-safe even with high voltage applied. The power safety features provide for safe system operation and installation and removal (disconnect) of components.

An optional overlay management network may be configured as one or more extra conductors 35 in the cable 14. In one or more embodiments, the overlay management network may use SPE to reduce cabling complexity. If Fibre Channel (FC) is needed for storage and use of converged Ethernet over the main fiber optical links is not possible or desired, additional FC strands may be provided. These overlay and additional storage networks may be broken out as logical interfaces on the servers themselves.

The optical fibers 27 may be operable to deliver, for example, 400+Gb/s (or other data rates including rates between 10 Gb/s and 100 Gb/s) to each endpoint 12.

The coolant distribution system 22 at the central hub 10 maintains a source of low-temperature coolant that is sent through distribution plumbing (such as a manifold), through the connector 29a, and down the cable's coolant supply line 28 to the remote device 12. The connector 29b on the remote device 12 is coupled to the cable 14, and the supply coolant is routed through elements inside the device such as heat sinks 25 and heat exchangers that remove heat (described further below with respect to FIG. 7). The warmed coolant may be aggregated through a return manifold and returned to the central hub 10 out the device's connector 29b and through the return tube 28 in the cable 14. The cable 14 returns the coolant to the central hub 10, where the return coolant passes through a heat exchanger at the coolant distribution system 22 on the central hub 10 to remove the heat from the coolant loop to an external cooling plant, and the cycle repeats. The heat exchanger at the coolant distribution system 22 may be a liquid-liquid heat exchanger, with the heat transferred to chilled water or a cooling tower circuit, for example. The heat exchanger may also be a liquid-air heat exchanger, with fans provided to expel the waste heat to the atmosphere. The hot coolant returning from the cable 14 may be monitored by sensors for temperature, pressure, and flow. Once the coolant has released its heat, it may pass back through a pump 39, and then sent back out to the cooling loop. One or more variable-speed pumps may be provided at the central hub 10 or remote device 12 to circulate the fluid around the cooling loop.

In an alternate embodiment, only a single coolant tube is provided within the cable 14 and high pressure air (e.g., supplied by a central compressor with an intercooler) is used as the coolant. When the air enters the remote device 12, it is allowed to expand and/or impinge directly on heat dissipating elements inside the device. Cooling may be accomplished by forced convection via the mass flow of the air and additional temperature reduction may be provided via a Joule-Thomson effect as the high pressure air expands to atmospheric pressure. Once the air has completed its cooling tasks, it can be exhausted to the atmosphere outside the remote device 12 via a series of check valves and mufflers (not shown).

In one or more embodiments, the coolant tubes 28 support the flow of liquid coolant or other fluid capable of cooling a thermal load. The coolant may comprise, for example, water, antifreeze, liquid or gaseous refrigerants, or mixed-phase coolants (partially changing from liquid to gas along the loop). The central hub 10 may also include one or more support systems to filter the coolant, supply fresh coolant, adjust anti-corrosion chemicals, bleed air from the loops, or fill and drain loops as needed for installation and maintenance of the cables 14. In one example, approximately 25 liters per minute of 25 degree C. water-based coolant may be provided to cool a 40 kW communications system contained within a rack. It is to be understood that this is only an example and other cooling rates or temperatures may be used to cool various loads. The cooling loops from all of the remote devices 12 may be isolated from one another or intermixed through a manifold and a large central heat exchanger for overall system thermal efficiency.

As previously noted, various sensors may monitor aggregate and individual branch coolant temperatures, pressures, and flow rate quantities at strategic points around the coolant loop (coolant distribution system 22, coolant tubes 28, heat sinks 25). Other sensors may monitor the current and voltage of the power delivery system at either end of power conductors 26. One or more valves may be used to control the amount of cooling delivered to the remote device 12 based upon its instantaneous needs. For example, the hub control processor 30 may control coolant distribution based on thermal and power sensors.

The hub control processor 30 may implement algorithms to provide various integrated management functions. For example, pulse power techniques may utilize continuous feedback from the receiving endpoint to close a feedback loop and maintain safe high power connectivity. Since the data and management networks are included in the same cable 14 and their routing/switching capability is included in the same chassis as the power hub function, the hub processor 30 can coordinate the two systems to efficiently interact. Combination of power and cooling also provides advantages. Pulse power can precisely measure and regulate the instantons power delivery to each endpoint. If the central hub's coolant delivery hub has valves to adjust the coolant flow down each combined cable, the hub control processor can perform closed-loop control over the coolant network to match the supplied power. Location of the data router in the same hub allows the power and cooling systems to monitor and quickly respond to changes in the computation loads as evident by changes in network traffic. Integration of the management networks into the same cable 14 and central hub 10 also opens up possibilities for closer monitoring and faster response to abnormal conditions in the data, power, or cooling networks, thereby enhancing the efficiency and safety of the entire data center.

As previously noted, the coolant distribution system 22 may interact with the data and power elements in the central hub 10 through the hub control processor 30. For example, each branch may drive a distinct combined cable to an individual server and have its own coolant metering function, which may include a network of valves or small pumps within the hub's coolant manifold assembly. Since the central hub 10 knows the instantaneous power draw of each server from its power system telemetry, the coolant flow down each branch can react to the cooling load required much faster, potentially eliminating the instabilities caused by thermal inertia, sensing lags, or delays in changing flow rates. Control algorithms at the hub control processor 30 may combine the operational states of the power, data, and cooling systems to optimize the operation and efficiency of the connected servers in both normal and emergency modes.

All utilities (power, data, cooling, management) provided by the combined cable 14 may interact with the hub control processor 30 to keep the system safe and efficient. In one or more embodiments, a distributed control system comprising components located on the central hub's control processor 30 and on the remote device's manager processor 34 may communicate over the management Ethernet conductors 35 in the combined cable 14. Sensors at the central hub 10 and remote device 12 may be used by the hub control processor 30 to monitor temperature, pressure, or flow. Servo valves or variable speed pumps may be used to insure the rate of coolant flow matches requirements of the remote thermal load. Temperature, pressure, and flow sensors may be used to measure coolant characteristics at multiple stages of the cooling loop (e.g., at the inlet of the central hub 10 and inlet of the remote device 12) and a subset of these sensors may also be strategically placed at outlets and intermediate points. The remote device 12 may include, for example, temperature sensors to monitor die temperatures of critical semiconductors, temperatures of critical components (e.g., optical modules, disk drives), or the air temperature inside a device's sealed enclosure. If the system detects additional power flow in power conductors 26 (e.g., due to a sudden load increase in CPU at remote device 12), the hub control processor 30 may proactively increase coolant flow in anticipation of an impending increase in heat sink temperature, even before the temperature sensors register it. The hub control processor 30 may also monitor the remote device's internal temperatures and adjust the coolant flow to maintain a set point temperature. This feedback system insures the correct coolant flow is always present. Too much coolant flow will waste energy, while too little coolant flow will cause critical components in the remote device 12 to overheat.

The central hub 10 may also include support for power and cooling resiliency. For example, a UPS (Uninterrupted Power Supply) function may provide support between the moment of an AC grid failure and stable power being available from a backup generator. As shown in FIG. 3, the central hub 10 may include a reserve battery 36 (e.g., one or more batteries) capable of supplying about 40 kW for the few minutes that it takes to start backup generators. In one example, 5-10 kW hours of battery storage capacity will fit into the same 1 RU/2 RU chassis that houses the central hub's router, cooling, and management capabilities. The reserve battery 36 and main power distribution system 20 may interact at the central hub 10 so that the power flow to each network device 12 from the reserve battery 36 can be moderated and controlled based upon the data that the data switch 21 sees being transmitted. For example, if a subset of the servers 12 supported by the central hub 10 is observed to have minimal network traffic, the UPS elements may shed those loads first as the battery reserve 36 gets closer to depletion. This enables the most critical subset of loads, based upon monitored network traffic, to stay up longer.

As shown in FIG. 3, the central hub 10 may also include a small insulated tank 31 for holding several tens of liters of pre-chilled reserve liquid coolant stored locally to recover from a temporary interruption of the central coolant supply. In one example, the liquid may be continuously cooled with a small Peltier refrigerator. If the main coolant loop stops circulating, runs dry, or has too high of an inlet temperature, valves and local pumps may be used to divert the pre-chilled coolant from the tank 31 through the coolant distribution manifold 22, down the composite cables 14 and into the equipment 12 that the central hub serves. Pre-chilling the coolant (down to the ambient dew point, or in more advanced systems to just above its freezing temperature) boosts its cooling capacity by allowing additional temperature rise before hitting the high thermal limit of the servers, thereby boosting the run time of the limited volume of coolant stored in the local reserve tank 31.

Pre-chilling of the reserve coolant in the tank 31 allows a limited volume of coolant that can be stored in a reasonably sized hub tank to go further in emergency cooling situations. For example, if the design temperature of liquid heat sinks in a server is 55 degrees C. and the coolant is stored at 30 degrees C. ambient, a certain run time may be supported based upon flow, dissipation, etc., with the 25 degrees C. increase through the servers. By keeping the reserve coolant below ambient (e.g., 5 degrees C.), a 50 degrees C. temperature rise may be used, doubling the cooling run time of the small reserve tank 31. There may also be different control modes implied for situations where the primary coolant supply lines run dry or run too hot. The reserve coolant may be metered to dilute the main coolant supply to cool it down in some cases (e.g., chiller plant coolant too hot) or isolated and recirculated to the loads in other cases (e.g., chiller plant flow failure).

In one or more embodiments, the reserve coolant tank 31 may be sized to have similar run-time under the expected load as the reserve battery 36. In one example, the run-time of the reserve battery 36 and reserve coolant tank 31 may be 5-10 minutes, which may be adequate to ride through many short-term utility interruptions and maintenance actions to the data center's power and cooling plant. If an interruption is expected to last longer than the supported run time, the reserve stores provide sufficient time to allow the servers 12 to save their states and perform an orderly shutdown before running out of power or dangerously overheating.

In one or more embodiments, a cable identifier may be provided for use in identifying a cable since there may be many cables 14 homing on the central hub 10 and it may be confusing to a technician trying to identify a cable that needs to be worked on. In one example, an identification capability may be integrated into the cable 14, connector 29a, connector 29b, or any combination thereof. The identifier element may cause the selected cable or connector to glow in order to identify the cable and may comprise, for example, an element (fiber) 37 in the cable 14 or LED 38 in one or both of the connectors 29a, 29b that may be illuminated in easily identifiable colors or blink patterns to quickly indicate a fault, such as power failure, loss of coolant flow/pressure, network error, etc. In one embodiment, the optical fiber 37 may be integrated along the length of the cable and the LED 38 provided within the central hub connector 29a to illuminate the cable. In another embodiment, a small LED is integrated into the connectors 29a, 29b on both ends of the combined cable 14 to provide a driver circuit within the connector body for receiving control messages and illuminating the LED with the selected color, blink pattern, or both. The entire length of the cable 14 may be illuminated through the use of "leaky" fiber, appropriate cable jacket material, and optical termination, for example.

The cable 14 may comprise various configurations of power conductors 26, optical fibers 27, management data wires (overlay networking link) 35, and coolant tubes 28 contained within the outer jacket 33 of the cable 14. The coolant tubes 28 may have various cross-sectional shapes and arrangements, which may yield more space and thermally efficient cables. Supply and return tube wall material thermal conductivity may be adjusted to optimize overall system cooling. The cable 14 may also be configured to prevent heat loss through supply-return tube-tube conduction, external environment conduction, coolant tube-power conductor thermal conduction, or any combination of these or other conditions. For example, a thermal isolation material may be located between coolant tubes 28 to prevent heat flow between hot coolant return and cold coolant supply tubes. The thermal isolation material may also be placed between the coolant tubes 28 and the outer jacket 33. In another embodiment, one or both coolant tubes 28 may be provided with a low thermal impedance path to the outside. Thermal paths may also be provided between the power conductors 26 and one of the coolant tubes 28 to use some of the cooling power of the loop to keep the power conductors 26 in the cables 14 cool.

In one or more embodiments, the cable's jacket 33 may include two small sense conductors (not shown) for use in identifying a leak in the cooling system. If a coolant tube develops a leak, the coolant within the jacket 33 causes a signal to be passed between these conductors, and a device such as a TDR (Time-Domain Reflectometer) at the central hub 10 may be used to locate the exact position of the cable fault, thereby facilitating repair.

In order to prevent coolant leakage when the cable 14 is uncoupled from the central hub 10 or remote device 12, the coolant lines 28 and connectors 29a, 29b preferably include valves (not shown) that automatically shut off flow into and out of the cable, and into and out of the device or hub. In one or more embodiments, the connector 29a, 29b may be configured to allow connection sequencing and feedback to occur. For example, electrical connections may not be made until a verified sealed coolant loop is established. The cable connectors 29a, 29b may also include visual or tactile evidence of whether a line is pressurized, thereby reducing the possibility of user installation or maintenance errors. The connectors 29a, 29b are preferably configured to mate and de-mate (couple, uncouple) easily by hand or robotic manipulator. The connectors 29a, 29b may also comprise quick disconnects for blind mating of the connector to a port at the central hub 10 or network device 12 as it is inserted into a rack, as described below with respect to FIG. 5. The cable 14 may also comprise quick disconnects at each end for mating with the connectors 29a, 29b.

In one or more embodiments, a redundant central hub (not shown) may provide backup or additional power, bandwidth, cooling, or management as needed in the network. For example, each heat sink 25 (or heat exchanger) at the network device 12 may comprise two isolated fluid channels, each linked to one of the redundant central hubs. If the coolant flow stops from one hub, the other hub may supply enough coolant (e.g., throttled up by the hub control processor 30) to keep the critical components operational. Isolation is essential to prevent loss of pressure incidents in one fluid loop from also affecting the pressure in the redundant loop. Both the primary and backup hub may also be used simultaneously to provide power to an equipment power circuit to provide higher power capabilities. Similarly, redundant data fibers may provide higher network bandwidth, and redundant coolant loops may provide higher cooling capacity. The hub control processor 30 may manage failures and revert the data, power, and cooling to lower levels if necessary.

Figure 4:
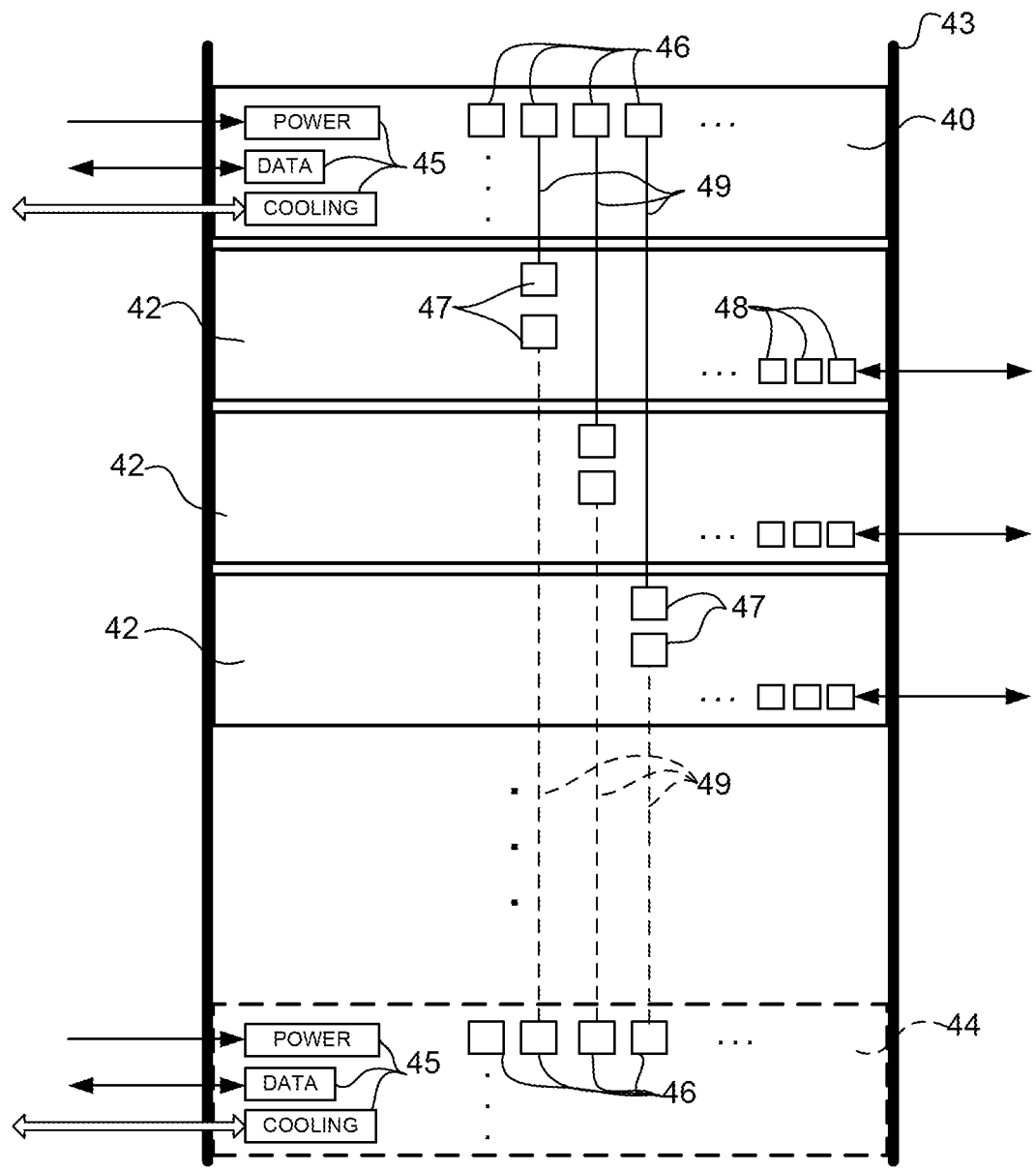
FIG. 4 is a schematic front view of the central hub in a rack with a plurality of network devices with the combined cable interfaces on a front panel of the network devices.

FIG. 4 illustrates an example of a central hub 40 and servers 42 located within a rack 43. It is to be understood that the term "rack" as used herein may refer to a server rack, cabinet, enclosure, frame, or any other equipment configured for receiving and supporting a plurality of network devices (e.g., central hub, servers, routers, switches, line cards, fabric cards, 1 RU devices, 2 RU devices, or any other network devices) that are inserted into front or rear openings (e.g., slots) of the rack or mounted on or connected to the rack to form a communications system (e.g., central hub and network devices located within the central hub's interconnect domain). Similarly, the term "rack mounted" as used herein refers to the network device mounted in any type of server rack, cabinet, enclosure, frame, or other equipment as described above.

As previously described, discrete data, power, management, and cooling interconnects typically found in data center racks are replaced with combined cable interconnects that provide all of these functions to greatly simplify installation, maintenance, and repair. The centralized hub 40 combines ToR switch/router functions, control, power distribution, cooling distribution, and management into a single integrated package, which minimizes rack space used by support functions. In this example, the central hub 40 is located at a top of the rack 43 and replaces a ToR switch. An optional redundant hub 44 may also be located on the rack 43, as described below. It is to be understood that the central hub 40 and redundant central hub 44 (if included) may be located in any position on the rack (e.g., top, bottom, or any other slot). In the example shown in FIG. 4, the central hub 40 and redundant hub 44 include interfaces 45 on a front panel for power, data, and cooling, respectively. As described above with respect to FIG. 3, the power interface receives power from a power grid or other external source, the data interface is in communication with a network backbone, and the coolant interface is in fluid communication with an external cooling plant. As previously noted, the central hub 40 or redundant hub 44 may also receive power, data, and cooling on a combined cable. A plurality of interfaces (ports) 46 for transmitting combined, power, data, management, and cooling to any number of servers 42 are also located on a front panel of the central hub 40 and redundant hub 44 in the example shown in FIG. 4. Each server 42 includes one or more interfaces (ports) 47 for receiving one or more combined cable 49 and may also include one or more ports 48 for connection to any number of other devices (e.g., IoT devices or other endpoint devices). As previously noted, the server 42 may, for example, provide PoE to an IoT device, sensor, or appliance, or other device. In the example shown in FIG. 4, each server 42 includes two ports 47 for connection to combined cables 49 in communication with the central hub 40 and redundant hub 44. Servers are slid into open slots in the rack and the single combined cable 49 (or two in cases where redundant hub 44 is used) is connected, completing the installation's power, data, management, storage, and high density cooling capabilities.

As previously described with respect to FIG. 2, the combined cables 49 connecting the central hub 40 to the servers 42 may be replaced with one combined cable with multiple taps in a taper topology.

Fault tolerance may be a concern for critical devices. If redundancy is needed, the backup hub 44 may be provided, with one or more of the servers 42 interfacing with two of the combined cables 49 (one connected to each hub). Each cable 49 may home on an independent hub 40, 44, with each hub providing data, power, cooling, and management. Redundant connections for power, data, cooling, and management may be provided to protect against failure of the central hub 40, its data connections to the Internet, primary power supplies, cooling system, or management module.

It is to be understood that the terms front, rear, or back, as used herein are relative terms based on the orientation of the rack 43 and network components 40, 42, 44 and should not be construed as limiting the arrangement or orientation of the components within the rack 43. In one or more examples, the rack 43 may be positioned next to a wall or another rack and may have limited accessibility to either a front or back opening. Thus, the cable connections (interfaces, ports) 46, 47 for coupling the combined cable 49 to the central hub 40, redundant hub 44, or servers 42 may also be located on a back panel, as described below with respect to FIG. 5.

Figure 5:
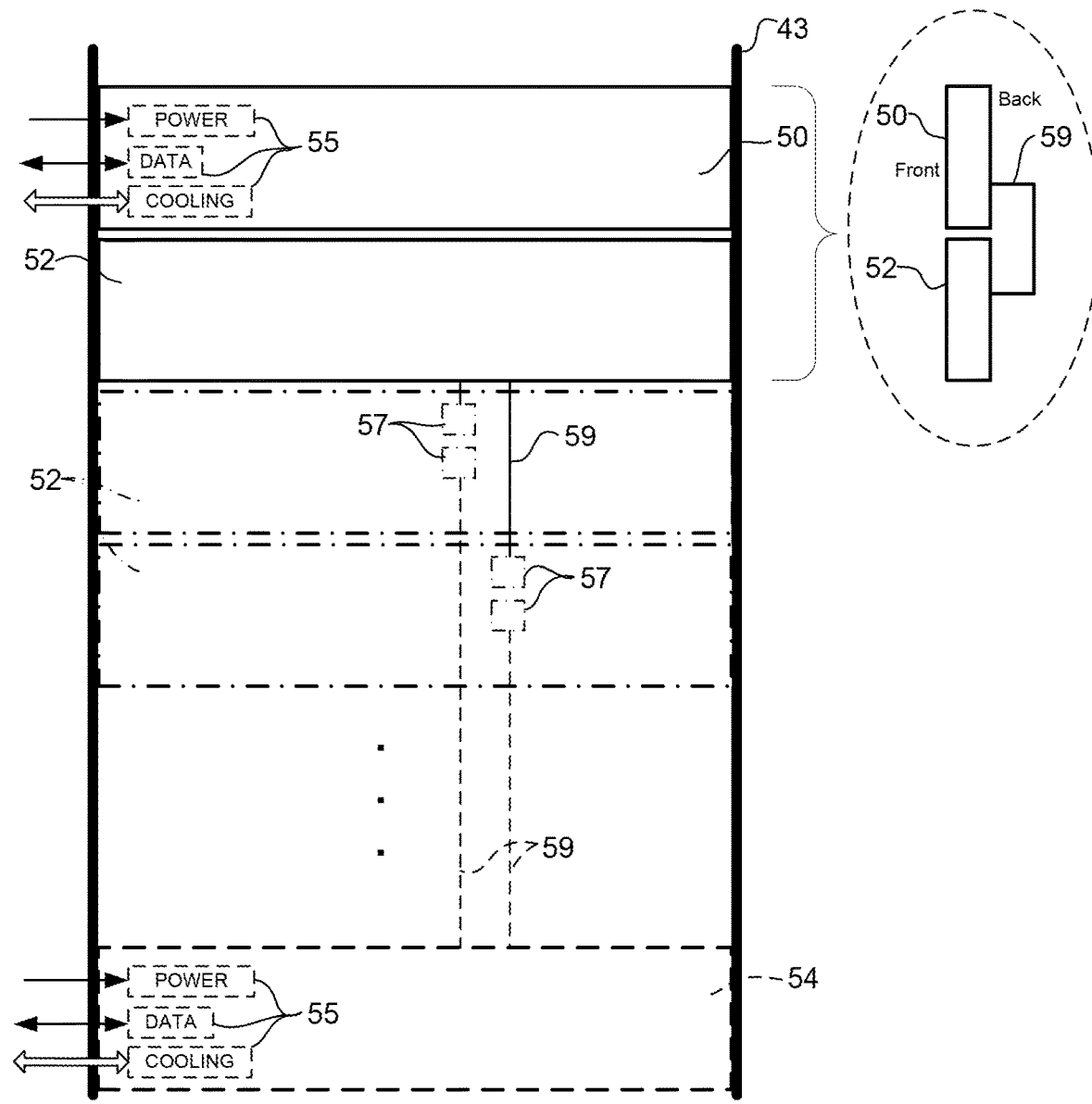
FIG. 5 is a schematic front view of the central hub in the rack with the combined cable interfaces on a back panel of the network devices.

As shown in FIG. 5, the combined cable connections from a central hub 50 or optional redundant hub 54 to servers 52 may also be located on the back of the hub and servers. A partial side view of the central hub 50, server 52, and combined cable 59 connected to a back of the central hub and server is shown in a cutout in FIG. 5. Two servers 55 are shown in phantom to illustrate the location of cables 59 and connectors 57 at a rear of the servers. In one example, the equipment rack 43 may be pre-staged with the central distribution hub 50 for data, power, management, and cooling on top and a plurality of combined endpoint cables 59 fanning out to the server positions down the rack. This may be used to support blind mate scenarios, allowing the servers 52 to be installed from the front with no rear access, with the single combined cable 59 pre-staged at the back of the rack 43 (e.g., similar to a backplane connector) or plugged in to a slack loop in cable 59 before the server is inserted into the rack.

Power, data, and cooling interfaces 55 at the central hub 50 and redundant hub 54 may be located on the front (face plate) or back of the hub.

It is to be understood that the systems shown in FIGS. 4 and 5 are only examples and that the embodiments described herein may be used in other systems comprising a different number or arrangement of components, without departing from the scope of the embodiments. For example, in a distributed computational environment such as industrial computing or fog networks, the central hub may be packaged differently and the cables may connect data, power, management, and cooling to distributed endpoints over distances in excess of 1 km.

Figure 6:
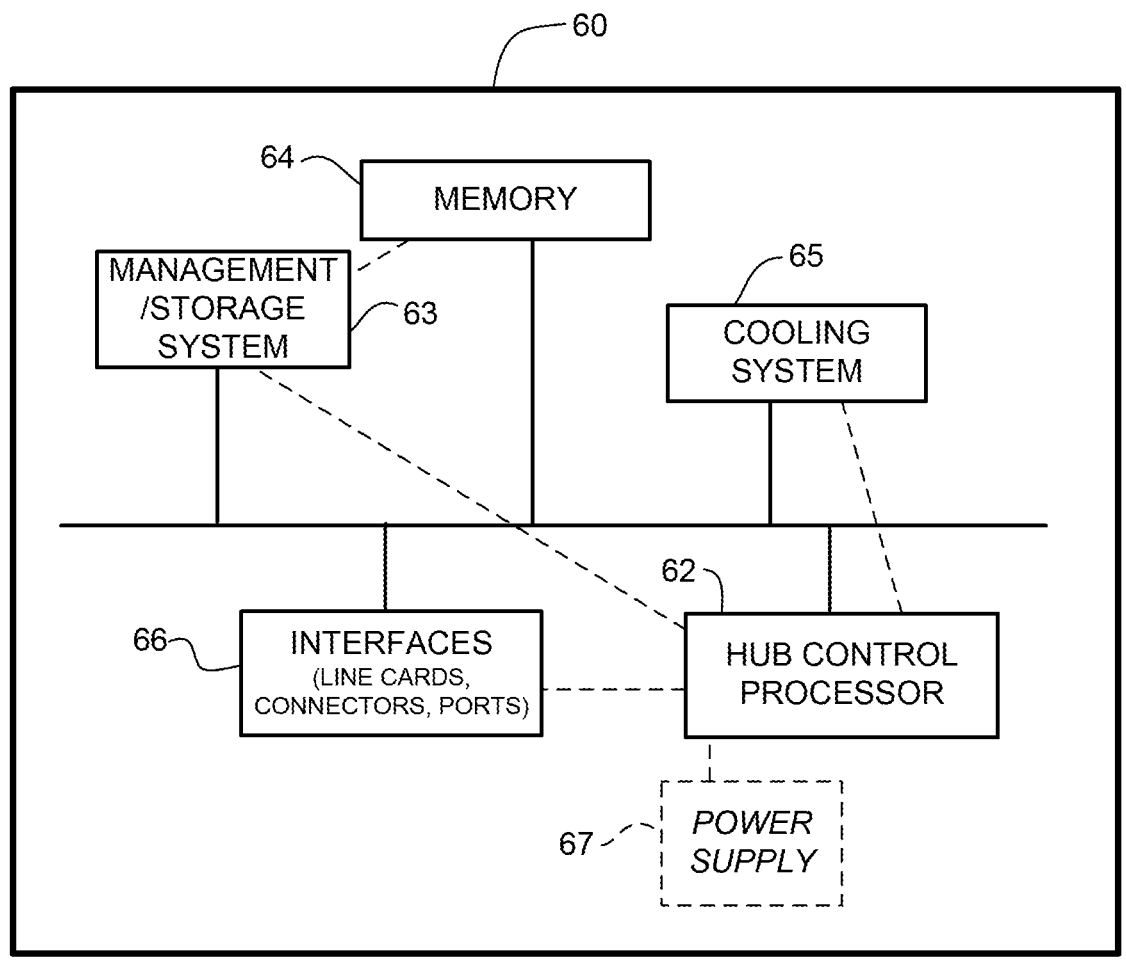
FIG. 6 depicts an example of a network device useful in implementing embodiments described herein.

FIG. 6 illustrates an example of a network device 60 (e.g., central hub 10 in FIG. 1) that may be used to implement the embodiments described herein. In one embodiment, the network device 60 is a programmable machine that may be implemented in hardware, software, or any combination thereof. The network device 60 includes one or more processor 62, management system 63, memory 64, cooling system (pumps, valves, sensors) 65, and interfaces (electrical, optical, fluid) 66.

The network device 60 may include any number of processors 62 (e.g., single or multi-processor computing device or system). The processor 62 may receive instructions from a software application or module, which causes the processor to perform functions of one or more embodiments described herein. The processor 62 may also operate one or more components of the management system 63, cooling system 65, or data system 66.

Memory 64 may be a volatile memory or non-volatile storage, which stores various applications, operating systems, modules, and data for execution and use by the processor 62. For example, components of the management system 63, control logic for cooling components 65, or other parts of the control system (e.g., code, logic, or firmware, etc.) may be stored in the memory 64. The network device 60 may include any number of memory components, which may also form part of a storage overlay.

Logic may be encoded in one or more tangible media for execution by the processor 62. For example, the processor 62 may execute codes stored in a computer-readable medium such as memory 64. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described below with respect to the flowchart of FIG. 8 or other functions such as power level negotiations, safety subsystems, or thermal control, as described herein.

The interfaces 66 may comprise any number of interfaces (e.g., power, data, and fluid connectors, line cards, ports, combined connectors 29a, 29b for connecting to cable 14 in FIG. 3) for receiving data, power, and cooling or transmitting data, power, and cooling to other devices. A network interface may be configured to transmit or receive data using a variety of different communications protocols and may include mechanical, electrical, and signaling circuitry for communicating data over physical links coupled to the network. One or more of the interfaces 66 may be configured for PoE+F (Fiber)+C (Cooling), PoE+F, PoE, PoF (Power over Fiber), or similar operation.

It is to be understood that the network device 60 shown in FIG. 6 and described above is only an example and that different configurations of network devices may be used. For example, the network device 60 may further include any suitable combination of hardware, software, algorithms, processors, devices, components, or elements operable to facilitate the capabilities described herein.

Figure 7:
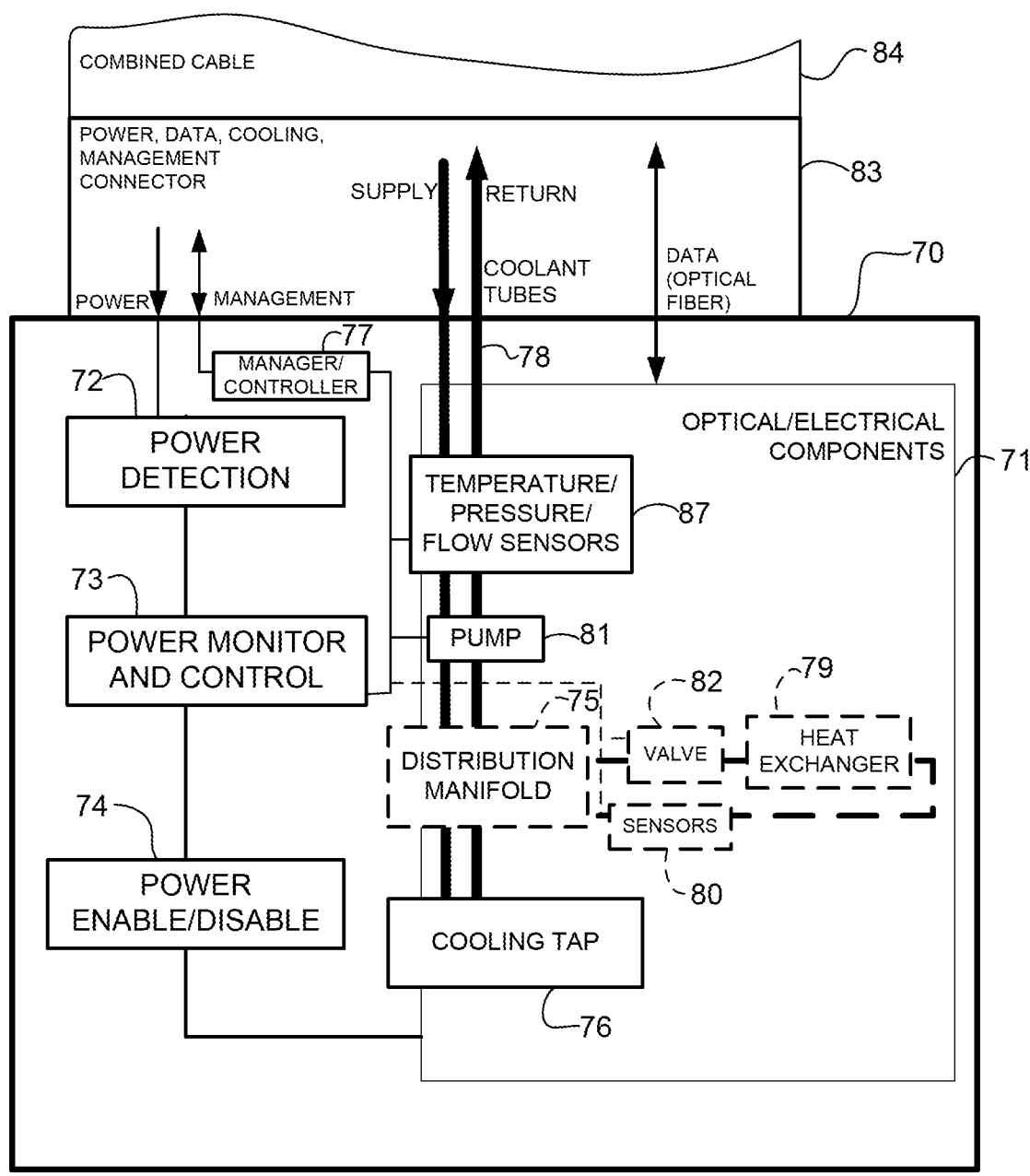
FIG. 7 is a block diagram illustrating power, data, cooling, and management at the network device, in accordance with one embodiment.

FIG. 7 is a block diagram illustrating components at a network device 70 (e.g., network device 12 in FIG. 1), in accordance with one embodiment. The system components provide for communication with the power source (e.g., central hub 10 in FIG. 1) during power up of the powered device and may also provide fault protection and detection. As previously described, the network device 70 receives power, management, cooling, and bidirectional data over a combined cable 84 coupled to a connector 83. The network device 70 includes optical/electrical components 71 for receiving optical data and converting it to electrical signals (or converting electrical signals to optical data) and power components including power detection module 72, power monitor and control unit 73, and power enable/disable module 74.

The power detection module 72 may detect power, energize the optical components 71, and return a status message to the power source. A return message may be provided via state changes on the power wires, over the optical channel, or over the Ethernet management channel. In one embodiment, the power is not enabled by the power enable/disable module 74 until the optical transceiver and the source have determined that the device is properly connected and the network device is ready to be powered. In one embodiment, the device 70 is configured to calculate available power and prevent the cabling system from being energized when it should not be powered (e.g., during cooling failure).

The power monitor and control device 73 continuously monitors power delivery to ensure that the system can support the needed power delivery, and no safety limits (voltage, current) are exceeded. The power monitor and control device 73 may also monitor optical signaling and disable power if there is a lack of optical transitions or management communication with the power source. Temperature, pressure, or flow sensors, 80, 87 may also provide input to the power monitor and control module 73 so that power may be disabled if the temperature at the device 70 exceeds a specified limit.

Cooling is supplied to the device 70 via cooling (coolant) tubes in a cooling loop 78, which provides cooling to the powered equipment through a cooling tap (heat sink, heat exchanger) 76, 79 and returns warm (hot) coolant to the central hub. The network device 70 may also include a number of components for use in managing the cooling. The cooling loop 78 within the network device 70 may include any number of sensors 80, 87 for monitoring aggregate and individual branch temperature, pressure, and flow rate at strategic points around the loop (e.g., entering and leaving the device, at critical component locations). The sensor 87 may be used, for example, to check that the remote device 70 receives approximately the same amount of coolant as supplied by the central hub to help detect leaks or blockage in the combined cable 84, and confirm that the temperature and pressure are within specified limits.

Distribution plumbing routes the coolant in the cooling loop 78 to various thermal control elements within the network device 70 to actively regulate cooling through the individual flow paths. For example, a distribution manifold 75 may be included in the network device 70 to route the coolant to the cooling tap 76 and heat exchanger 79. If the manifold has multiple outputs, each may be equipped with a valve 82 (manual or servo controlled) to regulate the individual flow paths. Thermal control elements may include liquid cooled heatsinks, heat pipes, or other devices directly attached to the hottest components (e.g., CPUs, GPUs, TPUs, power supplies, optical components, etc.) to directly remove their heat. The network device 70 may also include channels in cold plates or in walls of the device's enclosure to cool anything they contact. Air to liquid heat exchangers, which may be augmented by a small internal fan, may be provided to circulate cool the air inside a sealed box. Once the coolant passes through these elements and removes the device's heat, it may pass through additional temperature, pressure, or flow sensors, through another manifold to recombine the flows, and out to the coolant return tube. In the example shown in FIG. 7, the cooling system includes a pump 81 operable to help drive the coolant around the cooling loop 78 or back to the central hub, and also to provide redundancy if the pumping action of the central hub 10 is interrupted.

The distribution manifold 75 may comprise any number of individual manifolds (e.g., supply and return manifolds) to provide any number of cooling branches directed to one or more components within the network device 70. Also, the cooling loop 78 may include any number of pumps 81 or valves 82 to control flow in each branch of the cooling loop. This flow may be set by an active feedback loop that senses the temperature of a critical thermal load (e.g., die temperature of a high power semiconductor), and continuously adjusts the flow in the loop that serves the heat sink or heat exchanger 79. The pump 81 and valve 82 may be controlled by the management system/controller 77 and operate based on control logic received from the central hub 10 over the management communications channel in response to monitoring at the network device 70.

It is to be understood that the network device 70 shown in FIG. 7 is only an example and that the network device may include different components or arrangement of components, without departing from the scope of the embodiments. For example, the cooling system may include any number of pumps, manifolds, valves, heat sinks, heat exchangers, or sensors located in various locations within the coolant loop or arranged to cool various elements or portions of the device. Also, the network device 70 may include any number of power sensors or control modules operable to communicate with the hub control processor at the central hub to optimize power delivery and cooling at the network device.

Figure 8:
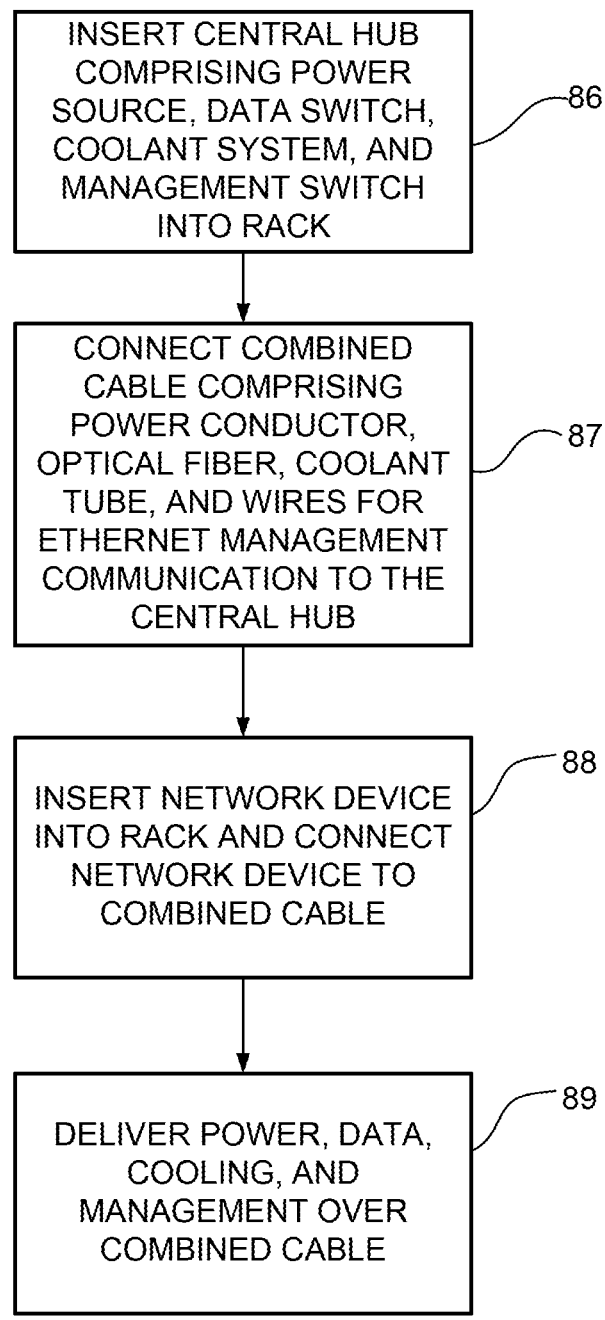
FIG. 8 is a flowchart illustrating an overview of a process for installation of the communications system with combined power, data, management, and cooling delivery, in accordance with one embodiment.

FIG. 8 is a flowchart illustrating an overview of a process for installation of an integrated communications system and delivery of combined power, data, management, and cooling in the communications system, in accordance with one embodiment. At step 86, the central hub 40 comprising a power source, data switch, coolant distribution system, and management switch in a chassis is inserted into the rack 43 (FIGS. 4 and 8). The combined cable 49 comprising an optical fiber (one or more optical fibers), a coolant tube (one or more coolant tubes), and wires (overlay network link) for Ethernet management communications, contained within an outer cable jacket is connected to the central hub 40 (step 87). The network device (e.g., server 42) is inserted into the rack and connected to the combined cable 49 (step 88). Power, data, cooling, and management are delivered to the network device 42 from the central hub 40 on the combined cable 49 (step 89).

It is to be understood that the process shown in FIG. 8 is only an example of a process for installing and operating a communications system with combined power, data, cooling, and management, and steps may be added, removed, combined, reordered, or modified without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A system comprising:
a central hub comprising a power source, a data switch, a coolant distribution system, and a management module contained within a chassis;
a plurality of network devices located within an interconnect domain of the central hub; and
at least one combined cable connecting the central hub to the network devices and comprising a power conductor, a data link, a coolant tube, and a management communications link contained within an outer cable jacket for providing power, data, cooling, and management to the network devices from the central hub.

2. The system of claim 1 wherein the central hub and said plurality of network devices are rack mounted devices.

3. The system of claim 2 wherein the combined cable connects to a back of the network devices with the network devices inserted into a front of the rack.

4. The system of claim 1 wherein said at least one combined cable comprises a plurality of combined cables, each of the combined cables connecting the central hub to one of the network devices.

5. The system of claim 1 wherein the combined cable comprises multi-tap connections to each of the network devices.

6. The system of claim 5 wherein the data link comprises an optical fiber and the central hub and said plurality of network devices form a passive optical network over the optical fiber.

7. The system of claim 1 further comprising a redundant central hub connected to said plurality of network devices with at least one backup combined cable.

8. The system of claim 1 wherein the power source is operable to provide at least 1000 watts of pulse power.

9. The system of claim 1 wherein the data link comprises a pair of optical fibers operable to deliver at least 100 Gb/s to each of the network devices.

10. The system of claim 1 wherein the central hub comprises a reserve power supply operable to supply power to said plurality of network devices for a specified period of time.

11. The system of claim 1 wherein the coolant distribution system comprises a chilled reserve coolant tank.

12. The system of claim 1 wherein the management communications link comprises a single pair of wires for Single Pair Ethernet (SPE) management communications.

13. The system of claim 1 wherein the management communications link defines a management overlay network.

14. The system of claim 1 wherein the central hub forms a storage overlay network with said plurality of network devices over the combined cable.

15. The system of claim 1 further comprising a light located within the combined cable or a connector coupled to the combined cable for use in identifying the combined cable or a status of the combined cable.

16. The system of claim 1 wherein the central hub operates as a Top of Rack (ToR) switch and said plurality of network devices comprise servers.

17. The apparatus of claim 1 wherein the apparatus is configured for insertion into a rack with said plurality of network devices.

18. An apparatus comprising:
a power source;
a data switch;
a coolant distribution system;
a management module;

at least one port for connection to a combined cable comprising a power conductor, a data link, a coolant tube, and a management communications link contained within an outer cable jacket for providing power, data, cooling, and management to a plurality of network devices from the central hub; and a hub control processor for control of interactions between the power, the data, and the cooling delivered on the combined cable to said plurality of network devices, wherein the power source, the data switch, the coolant distribution system, the management module, and the hub control processor are contained within a chassis.

19. A method comprising:

inserting a central hub into a rack, the central hub comprising a power source, a data switch, a coolant system, and a management module contained within a chassis;

connecting a combined cable comprising a power conductor, a data link, a coolant tube, and a management communications link within an outer cable jacket to the central hub;

inserting a network device into the rack and connecting the network device to the combined cable; and providing power, data, cooling, and management to the network device from the central hub over the combined cable.

20. The method of claim 19 wherein inserting the network device into the rack and connecting the network device to the combined cable comprises connecting the network device to the combined cable at a back of the network device with the network device inserted into a front opening in the rack.

* * * * *